United States Patent
Sugiura

[11] Patent Number: 6,064,785
[45] Date of Patent: May 16, 2000

[54] OPTICAL WAVE GUIDE PATH RECORDING MEDIUM AND OPTICAL REPRODUCING APPARATUS

[75] Inventor: Satoshi Sugiura, Saitama, Japan

[73] Assignee: Pioneer Electronic Corporation, Tokyo, Japan

[21] Appl. No.: 09/163,194

[22] Filed: Sep. 30, 1998

[30] Foreign Application Priority Data

Sep. 30, 1997 [JP] Japan .................................... 9-266833

[51] Int. Cl.$^7$ ...................................................... G02B 6/26
[52] U.S. Cl. ................. 385/30; 385/28; 385/147
[58] Field of Search ................................ 385/30, 27, 28, 385/29, 147

[56] References Cited

FOREIGN PATENT DOCUMENTS 2-210627  8/1990  Japan .

Primary Examiner—Phan T. H. Palmer

Attorney, Agent, or Firm—Morgan, Lewis & Bockius LLP

[57] ABSTRACT

An optical wave guide path recording medium includes an optical wave guide path recording layer including an optical wave guide path and an input light coupling portion for introducing a light beam, the optical wave guide path having a plurality of refractive index discontinuous portions arranged thereon, wherein at least one of a shape and a relative distance of the refractive index discontinuous portions is formed based on information to be recorded; and a light transmitting elastic body layer disposed apart from the optical wave guide path recording layer at such a distance that when the refractive index discontinuous portions generate a reflected wave guide light after the light beam is introduced into the optical wave guide path, evanescent wave coupling of the reflected wave guide light is induced with the optical wave guide path recording layer and the reflected wave guide light is transmitted to the light transmitting elastic body layer, the light transmitting elastic body layer having an output light coupling portion for outputting the reflected wave guide light.

14 Claims, 4 Drawing Sheets

OPTICAL WAVE GUIDE PATH RECORDING MEDIUM AND OPTICAL REPRODUCING APPARATUS

This application claims the benefit of Japanese Patent Application No. 9-266833, filed Sep. 30, 1997, which is hereby incorporated by reference.

BACKGROUND OF THE INVENTION

1. Field of the Invention

This invention relates to an optical recording medium, and more particularly, to an optical recording medium having an optical wave guide path. This invention also relates to an optical reproducing apparatus capable of reproducing recorded information from an optical wave guide path recording medium of the present invention.

2. Discussion of the Related Art

In Japanese Unexamined Patent Publication No. Hei 2-210627, a wave guide path recording medium is disclosed which has a flat body in which a plurality of channel type ridge optical wave guide paths are arranged in parallel on a substrate. In the optical wave guide paths, refractive index discontinuous portions, for example concave portions, are disposed for generating a plurality of reflected wave guide lights having different amplitudes and phases in the optical wave guide paths corresponding to information to be recorded.

In addition, different types of optical wave guide path recording medium have been proposed, including a disc type formed by winding a flat body having an optical wave guide path, a tape-shaped type, a card-stacked block type and the like. Reproduction of recorded information is carried out by, for example, an optical heterodyne interference signal reproduction method.

For the disc type optical wave guide path recording medium, information is read out by rotating the optical wave guide path recording medium with a spindle motor. In this case, a constant linear velocity (CLV) control is needed for a high density recording medium. Further, various servo controls for a reading laser beam are necessary. Also, warps and deviations of the optical wave guide path must be limited. Therefore, the conditions for the reproduction system in the disc type optical wave guide path recording medium are very strict.

Similarly, for the card-stacked block type optical wave guide path recording medium, because the reproduction of recorded information is carried out by scanning an optical coupling portion on an end face of the optical wave guide path with a light spot, a number of mechanical parts are used and various servo controls are required just like the above-mentioned disc type optical wave guide path recording medium. Therefore, the conditions of its reproduction system are also very strict.

Accordingly, although an optical wave guide path recording medium can be easily formed in a three dimensional stacked structure and is capable of reading a large amount of information rapidly in batch at a high signal-to-noise ratio, it is very difficult to reproduce the recorded information with a high quality.

SUMMARY OF THE INVENTION

Accordingly, the present invention is directed to an optical wave guide path recording medium and an optical reproducing apparatus that substantially obviates one or more of the problems due to limitations and disadvantages of the related art.

An objective of the present invention is to provide an optical wave guide path recording medium and an optical reproducing apparatus having a smaller size and capable of achieving a high reliability.

Another objective of the present invention is to provide an optical recording medium having an optical wave guide path containing a refractive index discontinuous portion in which a plurality of reflected wave guide lights having different amplitudes and phases are produced by introducing a light beam. A further objective of the present invention is to provide an optical reproducing apparatus capable of reproducing recorded information from the above-mentioned optical wave guide path recording medium.

Additional features and advantages of the present invention will be set forth in the description which follows, and will be apparent from the description, or may be learned by practice of the invention. The objectives and other advantages of the invention will be realized and attained by the structure and process particularly pointed out in the written description and claims hereof as well as the appended drawings.

To achieve these and other advantages and in accordance with the purpose of the present invention, as embodied and broadly described, an optical wave guide path recording medium of the present invention includes in optical wave guide path recording layer including an optical wave guide path having an input light coupling portion for introducing a light beam and a plurality of refractive index discontinuous portions arranged in the optical wave guide path, wherein at least one of the shape and relative distance of the refractive index discontinuous portion is formed based on information to be recorded, a light transmitting elastic body layer disposed apart from the optical wave guide path recording layer at such a distance that when the refractive index discontinuous portion generates reflected wave guide light after the light beam is introduced into the optical wave guide path, the optical wave guide path recording layer produces evanescent wave coupling of the reflected wave guide light with the optical wave guide path recording layer, and having an output light coupling portion for outputting a reflected wave guide light.

In another aspect, the present invention provides an optical wave guide path recording medium reproducing apparatus for reproducing information from an optical wave guide path recording medium which comprises an optical wave guide path recording layer including an optical wave guide path having an input light coupling portion for introducing a light beam and a plurality of refractive index discontinuous portions arranged in the optical wave guide path, wherein at least one of the shape and relative distance of the refractive index discontinuous portion is formed based on information to be recorded, and a light transmitting elastic body layer disposed apart from the optical wave guide path recording layer at such a distance that the optical wave guide path recording layer produces evanescent wave coupling of reflected wave guide light generated by the refractive index discontinuous portion when the light beam is introduced into the optical wave guide path, with the optical wave guide path recording layer and having a light transmitting elastic body layer having an output light coupling portion for outputting a reflected wave guide light, the optical wave guide path recording medium reproducing apparatus comprising an exciting means in contact with the elastic body layer for exciting the elastic body layer so as to produce surface elastic waves, a projecting means for introducing the light beam into the input light coupling portion of the optical wave guide path recording layer, and an optical detector for receiving a reflected wave guide light outputted from the output light coupling portion through the elastic body layer by evanescent wave coupling of a crest of the surface elastic wave, after the light beam is reflected by the refractive index discontinuous portion so that amplitude and phase thereof are modulated and photo-electric converting the reflected wave guide light to electric output.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
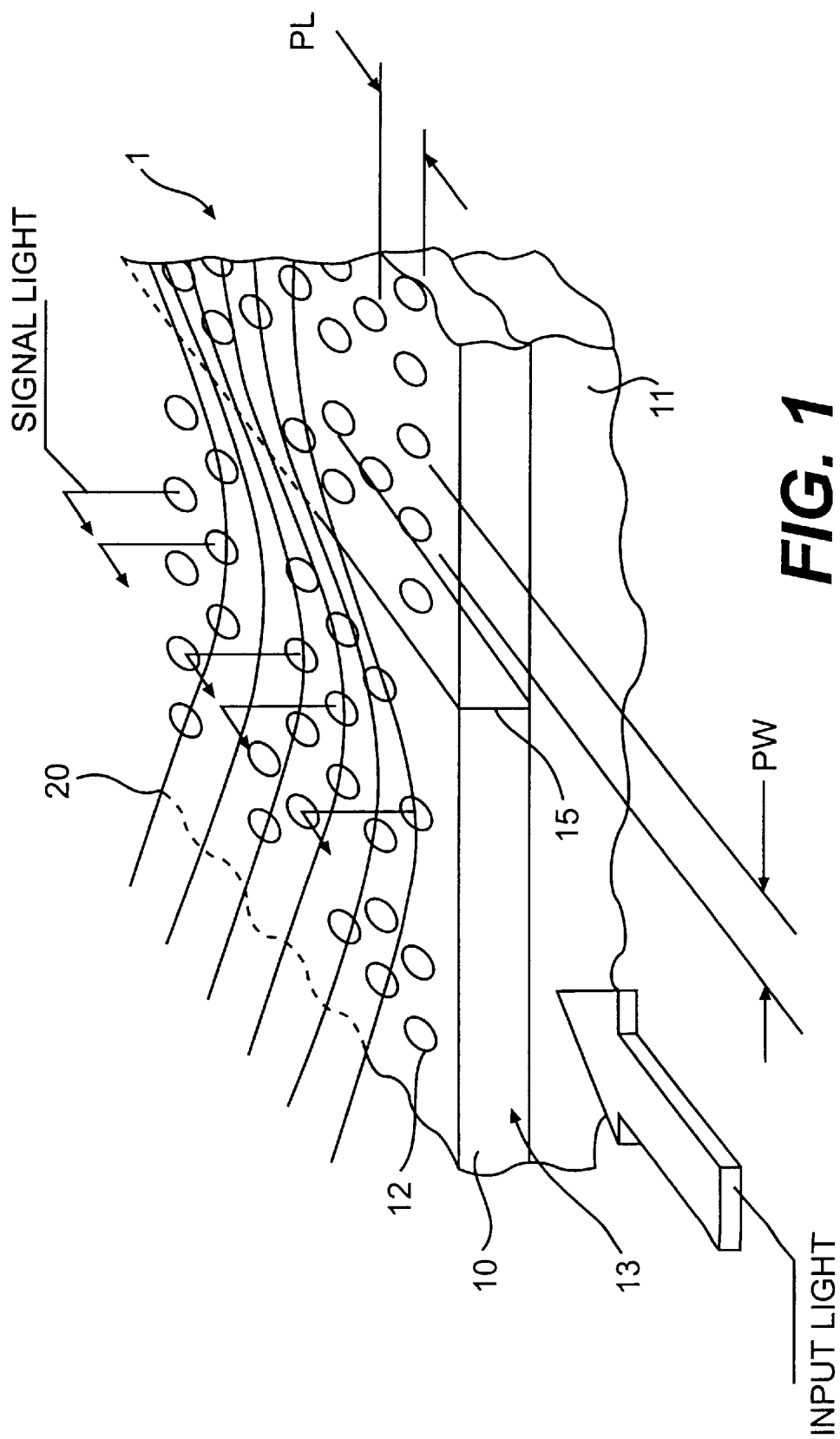
FIG. 1 is an enlarged partial perspective view of an optical wave guide path recording medium according to an embodiment of the present invention.

FIG. 1 is an enlarged partial perspective view of an optical wave guide path recording medium according to an embodiment of the present invention. As shown in FIG. 1, such an optical wave guide path recording medium includes an optical wave guide path recording layer 1 in which a plurality of channel type optical wave guide paths 10 for guiding a light beam are formed in parallel on a substrate 11 that forms a cladding with a lower refractive index than that of the optical wave guide paths 10. A plurality of refractive index discontinuous portions 12 are arranged on the top of the optical wave guide paths 10 and correspond to information to be recorded. When a light beam is introduced into the optical wave guide paths 10, the refractive index discontinuous portions 12 produce a plurality of reflected wave guide lights having different amplitudes and phases. On an upper boundary face of the optical wave guide paths 10, there exists a space SP (see FIG. 2). However, this space SP may be filled with a cladding material having a low refractive index which does not weaken surface elastic waves.

Each refractive index discontinuous portion 12 includes a concave portion (or convex portion) formed on the boundary face of one of the optical wave guide paths 10. That is, the concave portions of the refractive index discontinuous portion 12 are provided by changing either the shape or the relative distance from an end surface so that at least one of the shape and the relative distance is a variable based on the information to be recorded. In addition, reference points may be provided within the optical wave guide paths in forms of pre-pits. In such a case, the concave portions of the refractive index discontinuous portion 12 are provided by changing either the shape or the relative distance from the pre-pits in accordance with the information to be recorded.

As shown in FIG. 1, the concave portions (e.g., approximately 20 nm in diameter) of the refractive index discontinuous portions 12 are arranged in an extension direction of the channel type optical wave guide paths 10, in the form of a row of the refractive index discontinuous portions having a pitch PL of, for example, 20 nm. These rows of the refractive index discontinuous portions 12 are arranged in parallel to each other at a pitch PW of, for example, 40 nm. Therefore, 25 rows of the refractive index discontinuous portions 12 can be arranged in the optical wave guide path 10 of 1 $\mu$m wide. A laser beam for reading (shown as "Input Light" in FIG. 1) is projected onto an input light coupling portion on an end face 13 of the optical wave guide path 10. Optically transparent optical glass or plastic such as polycarbonate and polymethacrylate may be used as the composition material of the optical wave guide path 10. The channel type optical wave guide paths 10 are separated by nontransparent regions 15. This serves the purpose of confining the laser beam in the optical wave guide path 10.

Figure 2:
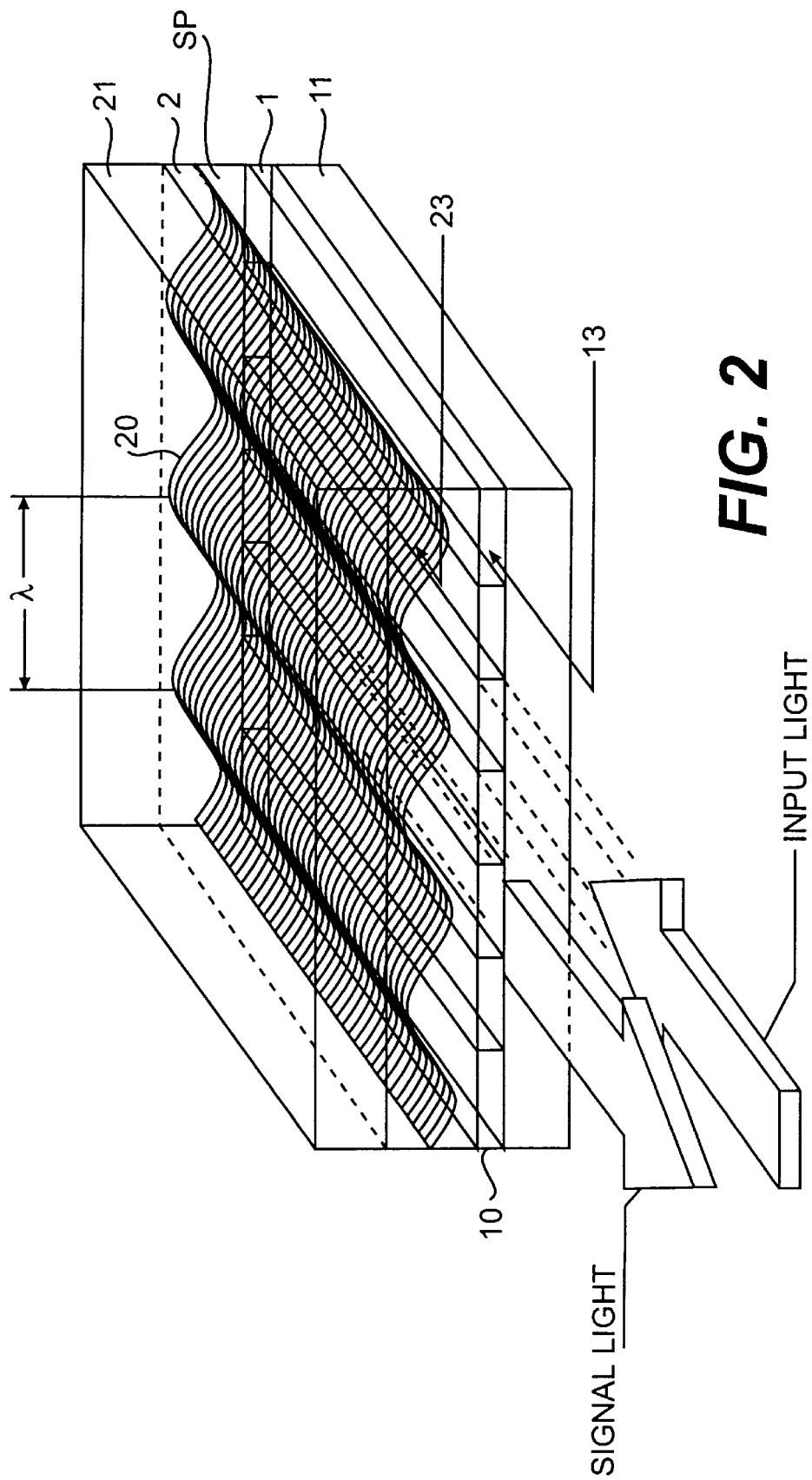
FIG. 2 is another enlarged partial perspective view of the optical wave guide path recording medium according to the present invention.

As shown in FIG. 2, the optical wave guide recording medium includes a light transmitting photo-elastic body layer 2 disposed apart from the optical wave guide path recording layer 1. The photo-elastic body layer 2 is a medium for transmitting a surface elastic wave 20 and has an output light coupling portion for outputting the reflected wave guide light. For example, an end face 23 may function as such an output light coupling portion. Although the elastic body layer 2 is preferably formed of a piezoelectric material such as lithium niobate, the suitable material is not restricted to piezoelectric material. In fact, the elastic body layer 2 may be formed of any photo-elastic material, for example.

As shown in FIG. 2, the surface elastic wave 20 is excited in the elastic body layer 2 by a surface elastic wave oscillator so that it is transmitted in a direction perpendicular to the rows of the refractive index discontinuous portions 12. One example of a suitable surface elastic wave 20 is a wave having a frequency of 100 MHz, a speed of 100 m/s and a wavelength ($\lambda$) of 1 $\mu$m.

Figure 3:
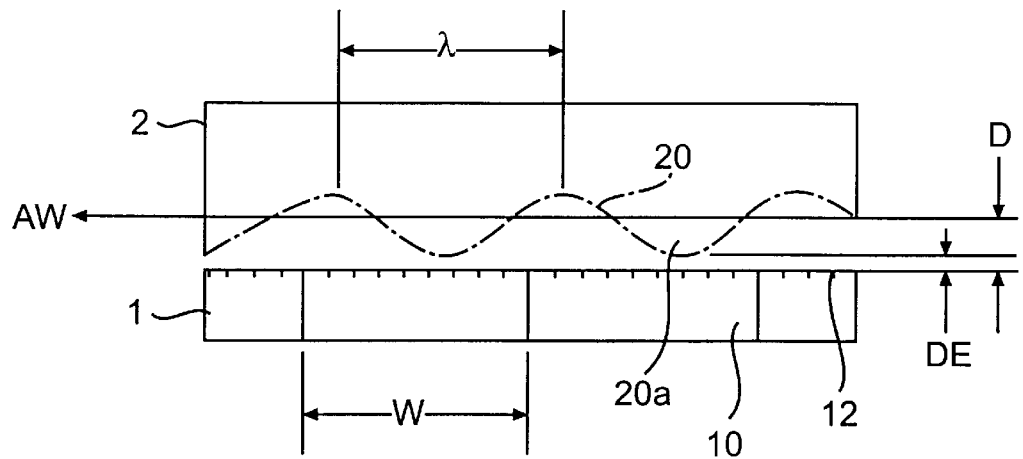
FIG. 3 is an enlarged partial sectional view of the optical wave guide path recording medium according to the present invention.

As shown in FIG. 3, a distance D between the elastic body layer 2 and the optical wave guide path recording layer 1 is such a dimension that when the refractive index discontinuous portion 12 generates a reflected wave guide light upon introduction of a light beam into the optical wave guide path 10, only a crest 20a (i.e., a tip portion) of the surface elastic wave 20 transmitted through the elastic body layer 2 induces evanescent wave coupling of the reflected wave guide light with the optical wave guide path recording layer 1. Therefore, when no light beam is introduced, the evanescent wave coupling is not produced.

The coupled optical energy damps as an exponential function depending on a distance from the surface of the optical wave guide path 10. As shown in FIG. 3, if the distance DE, in which the crest 20a of the surface elastic wave 20 of the elastic body layer 2 induces evanescent wave coupling with the optical wave guide path recording layer 1, is set to be less than approximately 100 nm, the reflected wave guide light by the refractive index discontinuous portion 12 is transmitted to the elastic body layer 2 through the crest 20a of the surface elastic wave 20. Because the crest 20a of the surface elastic wave 20 is transmitted in the elastic body layer 2 in a direction (see arrow AW) perpendicular to the extension direction of the optical wave guide path or the rows of the refractive index discontinuous portions, the crest 20a scans the rows of the refractive index discontinuous portions to read the reflected wave guide light or recorded signal light. Therefore, as shown in FIG. 3, a width W of the channel type wave guide path 10 in a direction perpendicular to the extension direction thereof is set to be less than a wavelength λ of the surface elastic wave 20. Also, by scanning every channel type wave guide path with the crest 20a, the recorded signal light of a plurality of the refractive index discontinuous portion rows can be obtained from the elastic body layer 2 for each optical wave guide path 10.

Figure 4A:
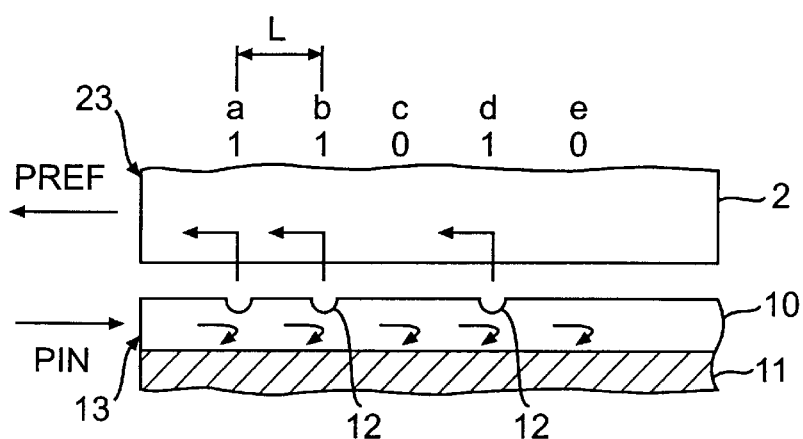
FIGS. 4A–4C are diagrams for explaining the principle of reproducing signals from the optical wave guide path recording medium according to the present invention.

As shown in FIG. 4A, each refractive index discontinuous portion 12 formed in the wave guide path 10 generates a reflected wave guide light Pref (that is, a signal light with its amplitude and phase modulated). The reflected wave guide light Pref has an amplitude and phase depending on a complex reflectivity which varies with a relative position from the end face 23 and the shape of the refractive index discontinuous portion, corresponding to the incident wave guide light Pin.

Figure 4B:
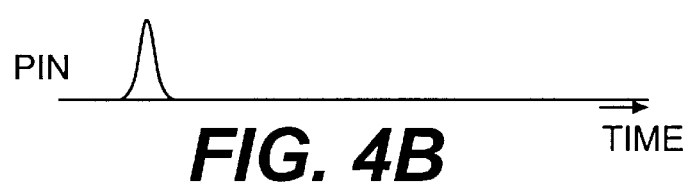
Figure 4C:
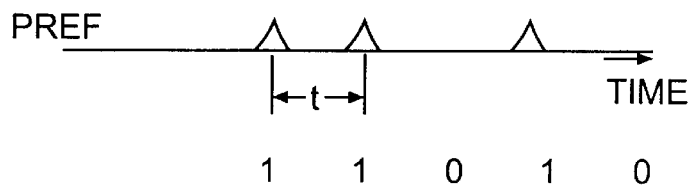

In an example shown in FIG. 4A, information of 1, 1, 0, 1, 0 is recorded corresponding to whether or not the concave portion of the refractive index discontinuous portion 12 exists on positions "a", "b", "c", "d", and "e". Note the positions "a", "b", "c", "d", and "e" are spaced at an equal distance L apart from one another. When a laser beam pulse Pin, shown in FIG. 4B for example, is guided into the wave guide path 10, the reflected wave guide light Pref is converted to a plurality of optical pulse signal lights having different amplitude and phase information with a time interval "t" as shown in FIG. 4C corresponding to such recorded information. Therefore, the reflected wave guide light Pref is transmitted to the elastic body layer 2 through the crest 20a of the surface elastic wave 20 by evanescent wave coupling. As a result, it is possible to obtain a plurality of optical pulse recording signal lights from the end face 23 of the elastic body layer 2. Further, it is permissible to stack the above described optical wave guide path recording mediums.

Figure 5:
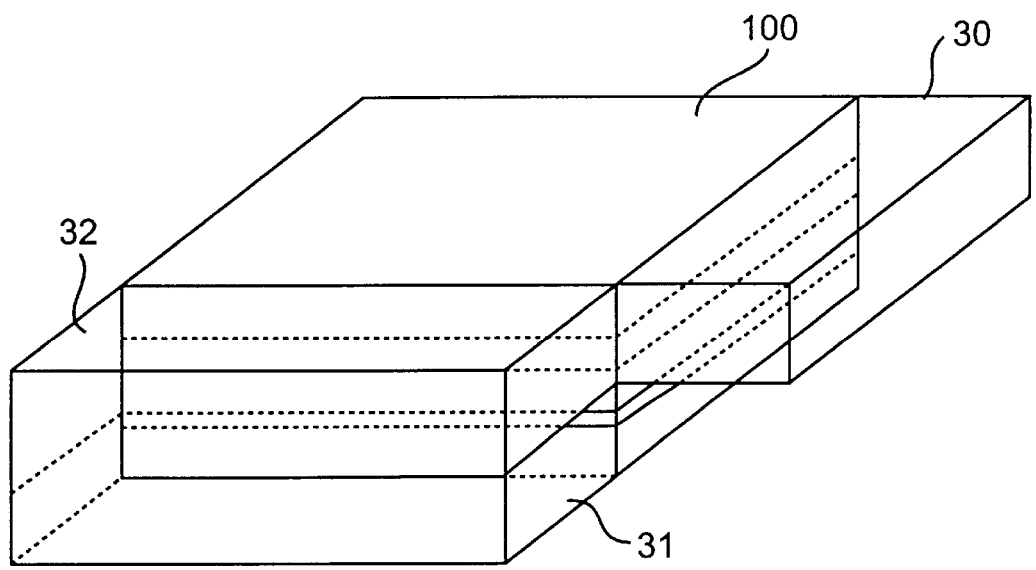
FIG. 5 is a schematic perspective view showing major parts of an optical reproduction apparatus for reading information from the optical wave guide path recording medium according to the present invention.

FIG. 5 shows an apparatus for reproducing the recorded information from a rectangular solid chip 100, with a dimension, for example, of approximately 10 mm×10 mm×5 mm of the above described optical wave guide path recording medium. In the apparatus, a surface elastic wave transducer 30 is in contact with an elastic body layer end face at a side of the chip 100 and excites that end face to generate surface elastic waves.

A laser beam projecting device 31 is in contact with an end face (i.e. input light coupling portion of the optical wave guide path) of the optical wave guide path recording layer on a side of the chip 100 at the right angle and projects a light beam thereinto. The laser beam projecting device 31 may be so constructed that an end thereof is connected to a single laser and a plurality of optical fibers branched therefrom are each connected to the end face of the optical wave guide path. Further, the laser beam projecting device 31 may be a semiconductor laser array connected to each optical wave guide path.

As shown in FIG. 5, a light receiving element array 32 is in contact with the elastic body end face (i.e., output light coupling portion) on a side of the chip 100 just above the laser beam projecting device 31 and contains a plurality of light receiving elements arranged for photo-electrically converting the received light to an electric output. In the light receiving element array 32, the wave guide light, reflected by the refractive index discontinuous portions so that its amplitude and phase are modulated, is transmitted through the elastic body layer by evanescent wave coupling with the crest of the surface elastic wave and then outputted from the output light coupling portion. Therefore, the plural light receiving elements in the light receiving element array 32 are in contact with the elastic body layer end face just above the optical wave guide path end face, corresponding to each optical wave guide path.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. An optical wave guide path recording medium comprising:

an optical wave guide path recording layer including an optical wave guide path and an input light coupling portion for introducing a light beam, the optical wave guide path having a plurality of refractive index discontinuous portions arranged thereon, wherein at least one of a shape and a relative distance of the refractive index discontinuous portions is formed based on information to be recorded; and a light transmitting elastic body layer disposed apart from the optical wave guide path recording layer at such a distance that when the refractive index discontinuous portions generate a reflected wave guide light after the light beam is introduced into the optical wave guide path, evanescent wave coupling of the reflected wave guide light is induced with the optical wave guide path recording layer and the reflected wave guide light is transmitted to the light transmitting elastic body layer, the light transmitting elastic body layer having an output light coupling portion for outputting the reflected wave guide light.

2. The optical wave guide path recording medium according to claim 1, wherein a distance between the optical wave guide path recording layer and a crest of a surface elastic wave transmitted in the light transmitting elastic body layer for producing the evanescent wave coupling is less than approximately 100 nm.

3. The optical wave guide path recording medium according to claim 1, wherein the plurality of refractive index discontinuous portions include a concave portion or a convex portion on a boundary face of the optical wave guide path.

4. The optical wave guide path recording medium according to claim 1, wherein the optical wave guide path is formed of optically transparent optical glass or plastic.

5. The optical wave guide path recording medium according to claim 4, wherein the optical wave guide path is formed of polycarbonate or polymethacrylate.

6. The optical wave guide path recording medium according to claim 1, wherein the light transmitting elastic body layer is formed of a photo-elastic material.

7. The optical wave guide path recording medium according to claim 6, wherein the light transmitting elastic body layer is formed of a piezoelectric material.

8. The optical wave guide path recording medium according to claim 7, wherein the light transmitting elastic body layer is formed of lithium niobate.

9. The optical wave guide path recording medium according to claim 1, wherein the optical wave guide path is of a channel type optical wave guide path and a plurality of the channel type optical wave guide paths are arranged in parallel between nontransparent regions of the optical wave guide path recording layer.

10. The optical wave guide path recording medium according to claim 9, wherein the plurality of refractive index discontinuous portions are arranged in rows parallel to each other, each of the refractive index discontinuous portion being disposed in an extension direction of the channel type optical wave guide path.

11. The optical wave guide path recording medium according to claim 10, wherein a surface elastic wave is transmitted in the light transmitting elastic body layer, in a direction perpendicular to the rows of the refractive index discontinuous portions.

12. The optical wave guide path recording medium according to claim 11, wherein a width of the channel type optical wave guide path in a direction perpendicular to the extension direction thereof is less than a wavelength of the surface elastic wave.

13. A reproducing apparatus for reproducing information from an optical wave guide path recording medium which, wherein the optical wave guide path recording medium comprises:

an optical wave guide path recording layer including an optical wave guide path and an input light coupling portion for introducing a light beam, the optical wave guide path having a plurality of refractive index discontinuous portions arranged thereon, wherein at least one of a shape and a relative distance of the refractive index discontinuous portions is formed based on information to be recorded; and a light transmitting elastic body layer having an output light coupling potion for outputting a reflected wave guide light generated by the refractive index discontinuous portions when the light beam is introduced into the optical wave guide path, the light transmitting elastic body layer being disposed apart from the optical wave guide path recording layer at such a distance that evanescent wave coupling of the reflected wave guide light is induced with the optical wave guide path recording layer and the reflected wave guide light is transmitted to the light transmitting elastic body layer, and wherein the reproducing apparatus comprises:
exciting means in contact with the light transmitting elastic body layer for exciting the light transmitting elastic body layer to produce a surface elastic wave;

projecting means for introducing the light beam into the input light coupling portion of the optical wave guide path recording layer; and optical detecting means for receiving the reflected wave guide light outputted from the output light coupling portion through the light transmitting elastic body layer by evanescent wave coupling of a crest of the surface elastic wave, after the light beam is reflected by the refractive index discontinuous portions so that an amplitude and a phase thereof are modulated, and for photo-electrically converting the reflected wave guide light to an electric output.

14. A reproducing apparatus for reproducing information from an optical wave guide path recording medium which, wherein the optical wave guide path recording medium comprises:

an optical wave guide path recording layer including an optical wave guide path, the optical wave guide path having a plurality of refractive index discontinuous portions arranged thereon, wherein at least one of a shape and a relative distance of the refractive index discontinuous portions represents information to be recorded; and a light transmitting elastic body layer having an output light coupling portion for outputting a reflected wave guide light generated by the refractive index discontinuous portions when a light beam is introduced into the optical wave guide path, the light transmitting elastic body layer being disposed apart from the optical wave guide path recording layer at such a distance that evanescent wave coupling of the reflected wave guide light is induced with the optical wave guide path recording layer and the reflected wave guide light is transmitted to the light transmitting elastic body layer, and wherein the reproducing apparatus comprises:
a wave transducer in contact with the light transmitting elastic body layer for exciting the light transmitting elastic body layer to produce a surface elastic wave;

a laser beam projector for introducing the light beam into the optical wave guide path recording layer; and a light receiving element array for receiving the reflected wave guide light outputted from the output light coupling portion through the light transmitting elastic body layer by evanescent wave coupling of a crest of the surface elastic wave, after the light beam is reflected by the refractive index discontinuous portions so that an amplitude and a phase thereof are modulated, and for photo-electrically converting the reflected wave guide light to an electric output.

* * * * *